United States Patent [19]

Smith et al.

[11] Patent Number: 4,500,963
[45] Date of Patent: Feb. 19, 1985

[54] AUTOMATIC LAYOUT PROGRAM FOR HYBRID MICROCIRCUITS (HYPAR)

[75] Inventors: David C. Smith, Williamstown; Richard Noto, Maple Shade, both of N.J.

[73] Assignee: The United States of America as represented by the Secretary of the Army, Washington, D.C.

[21] Appl. No.: 445,341

[22] Filed: Nov. 29, 1982

[51] Int. Cl.³ .............................................. G06F 15/20
[52] U.S. Cl. .................................... 364/300; 364/488
[58] Field of Search ........................ 364/488, 489–491, 364/300

[56] References Cited

U.S. PATENT DOCUMENTS

| | | | |
|---|---|---|---|
| T938,005 | 9/1975 | Colton et al. | 364/300 |
| T940,008 | 11/1975 | Oden et al. | 364/300 |
| T940,013 | 11/1975 | Ho | 364/300 |
| T940,020 | 11/1975 | Brechling et al. | 364/300 |
| T944,001 | 3/1970 | Hanan et al. | 364/400 |
| 3,705,409 | 12/1972 | Brayton | 364/488 X |
| 4,377,849 | 3/1983 | Finger et al. | 364/300 X |
| 4,386,403 | 5/1983 | Hsieh et al. | 364/300 |

Primary Examiner—Edward J. Wise
Attorney, Agent, or Firm—Anthony T. Lane; Jeremiah G. Murray; Robert A. Maikis

[57] ABSTRACT

A computer program for the fully automatic layout of hybrid microcircuits. The program, under certain options, guarantees one-hundred percent routing connectivity for components ranging from discretes to VLSI. Special features such as bottom-up or top-down routing, sequential level routing and user-defined grid spacing provide extensive design flexibility.

6 Claims, 8 Drawing Figures

4,500,963

AUTOMATIC LAYOUT PROGRAM FOR HYBRID MICROCIRCUITS (HYPAR)

STATEMENT OF GOVERNMENT INTEREST

The Government has rights in this invention pursuant to contract No. DAAK20-80-C-0291 awarded by Department of the Army.

BACKGROUND OF THE INVENTION

This invention relates to an automatic routing layout system, and more particularly, to a computer program for the fully automatic layout of hybrid microcircuits.

In this design of hybrid microcircuits, the common approach to route layout is the interactive graphics procedure whereby the designer creates a specific layout and uses a computer to store and, in some cases, verify the entries. The layout is actually created by the designer with record-keeping assistance from the computer. Design in the interactive mode requires the user to spend large amounts of time creating and describing the routing solution to the machine and to be constantly wary of introducing errors into the layout.

An automatic layout system, in comparison to an interactive layout system, may be defined as one which accepts input data in the form of a network list, element description, and program options from the user and automatically and independently routes all module interconnections to produce an output containing all necessary artwork instructions to fabricate the hybrid specified. The layout is produced solely from the program algorithm operation on the input data without user intervention.

SUMMARY OF THE INVENTION

The object of this invention is to provide a fully automatic layout system for hybrid microcircuits which can guarantee complete routing connectivity while requiring only minimal user interaction.

The program according to the invention requires user intervention only at the input phase to provide design constraints and under preferred options, guarantees one-hundred percent logic routing connectivity.

The program comprises essentially four separate phases of operation: input, module placement, routing and output. In the input phase, all design constraints including hybrid size, module position and logic interconnection are supplied by the user. It is only during this phase that the hybrid designer is required to interact with the layout program.

The module placement phase serves to improve potential logic routing channels by sliding and shifting the modules about the hybrid surface in an effort to allocate larger amounts of free space at the positions where the most dense routing is expected to occur. The modules remain fixed, as specified at input, only in the relative sense with respect to each other and a limited amount of shifting is permited in this phase.

The routing phase breaks the list of logic interconnections into two-pin pairs to be used by the routing routine. After placing routes for the power bus, power signal and any additonal user-identified connections, the remaining logic routing is created in sequential adjacent levels, two at a time. When all routing is accomplished for particular level, or when no further routing is possible, the program examines all of the signal routes on the level and attempts to eliminate crossovers and vias which have been created during the routing phase. the routing phase is repeated for each pair of adjacent levels unit all routing has been accomplished or until the user-specified maximum level has been routed.

The last phase, output, makes a final attempt at eliminating vias in the completed structure. The information is then converted into Banning Artwork Language supplying all necessary data for fabricating the hybrid.

The Automatic Layout Program for Hybrid Microcircuits (HYPAR) was first publicly presented before the International Society for Hybrid Microelectronics in October, 1981. The published report of the proceedings of this conference is herein incorporated by reference. ("Automatic Layout Program for Hybrid Microcircuits," The International Journal for Hybrid Microelectronics, Volume 4, Number 2; October, 1981).

DETAILED DESCRIPTION OF THE INVENTION

Figure 1:
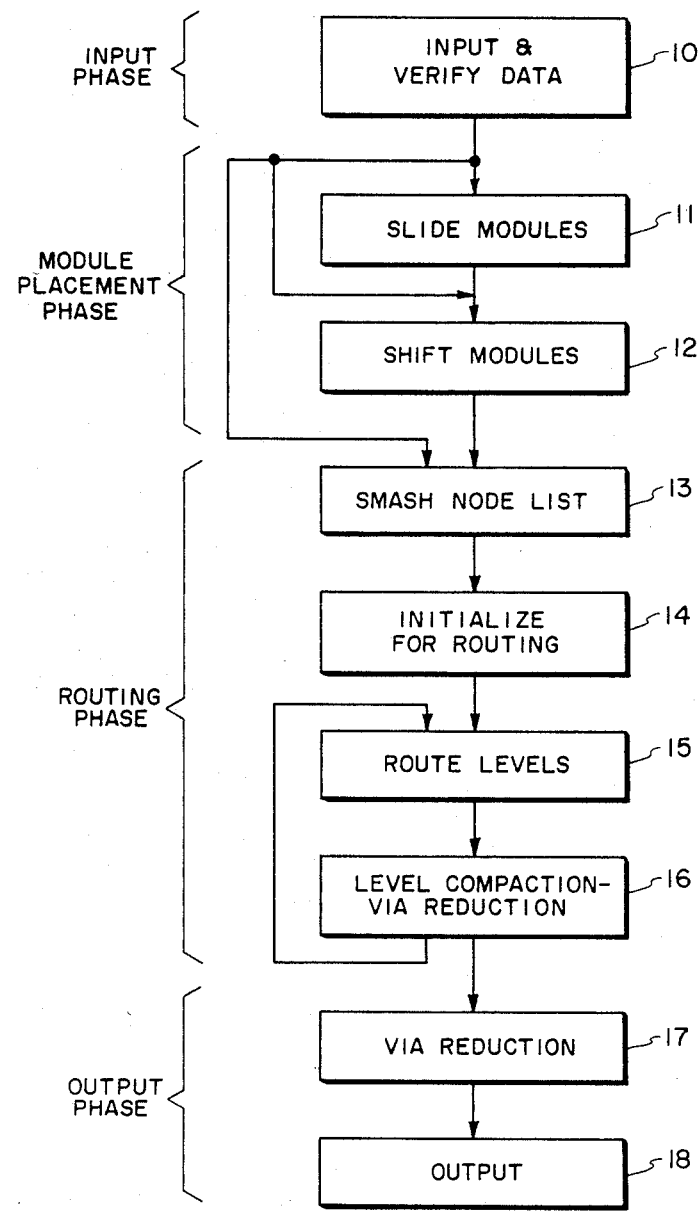
FIG. 1 is a system flowchart.

The Automatic Layout Program for Hybrid Microcircuits (HYPAR) is a network layout program for designing hybrid modules. As shown in FIG. 1, the system operates in four separate phases: input, module placement, logic routing and output.

Hybrid modules are typically made up of a substrate having fixed modules or components mounted thereon, and a number of routing levels stacked above the substrate providing paths for routing between modules. A single routing level is generally shown as a two-dimensional grid having coordinate points which represent either points solely for use in intralevel routing or points which allow access to adjacent levels for interlevel routing known as via locations. In order to provide for greater potential routability and therefore, more dense packing of routing levels, a constraint is imposed such that vias will never occur in adjacent coordinate positions in either the x, y or z direction.

Figure 2:
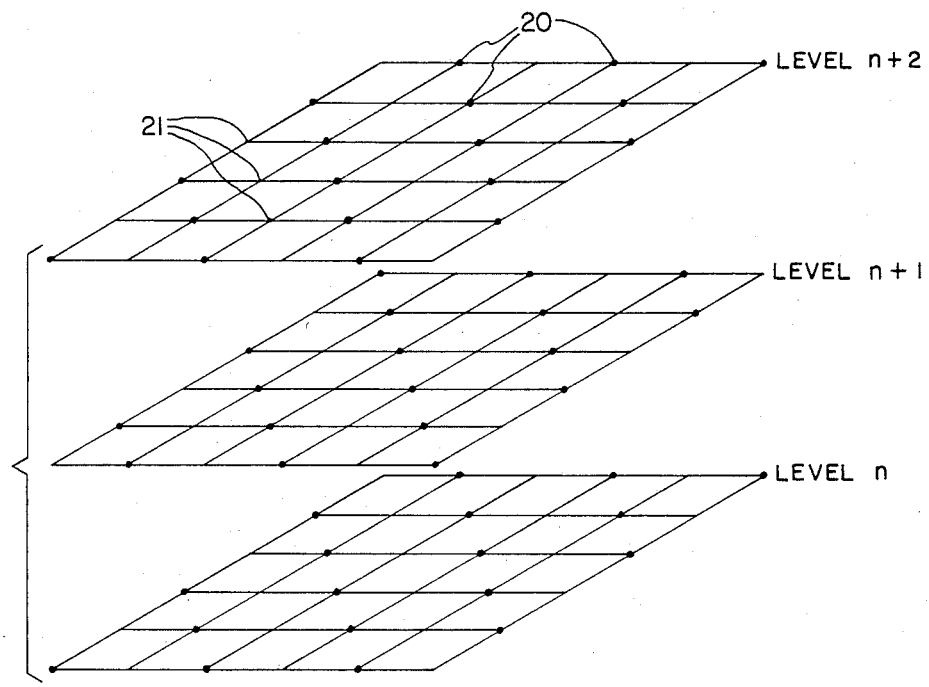
FIG. 2 is a three-dimensional view of three adjacent routing levels.

For reference purposes only, FIG. 2 illustrates the grid layouts for three adjacent routing levels of a 6-by-6 hybrid. The grid locations 20 indicated by a dot represent allowable via coordinates while all other locations 21 represent non-via locations. As shown in FIG. 2, allowable via locations do not occur in adjacent positions in either the x, y or z direction. This constraint eliminates the possibility that an area on one level could become completely surrounded by via locations and thus be inaccessible for signal routing purposes.

Figure 3:
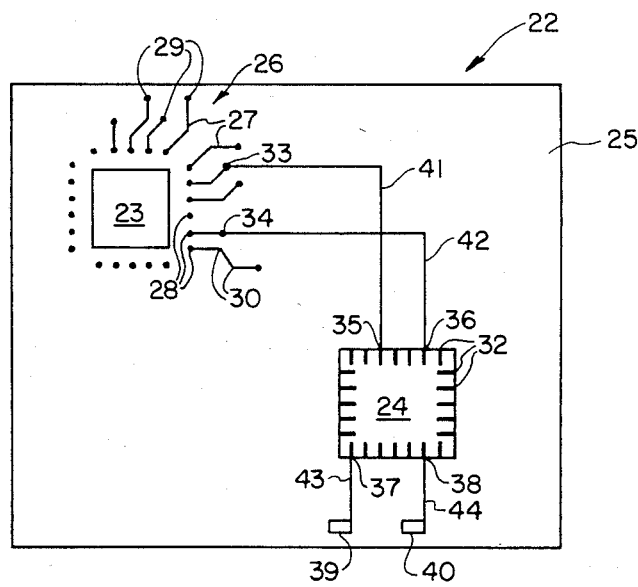
FIG. 3 is a plan view of a hybrid module constructed in accordance with the invention.

FIG. 3 shows a simplified hybrid module 22 constructed in accordance with this invention. Fixed position component modules 23 and 24 are mounted on the hybrid surface 25 by chip-and-wire mounting in the case of module 23, and by posted leadless carrier module 24. In chip-and-wire mounting, a module footprint 26 made up of connectors 27 from pad pins 28 to route pins 29 is used to disperse signal routes to more widely spaced grid locations in order to make the routing process easier. The pad pins 28 in FIG. 3 are shown separate from the component module 23 in order to emphasize the points of connection for the module footprint. Also, the connectors 27 from pad pins 28 to route pins 29 may have from zero to two breakpoints 30 each. In posted leadless carrier mounting, shown in FIG. 3 as component module 24, routing connectors are directly contacted to posts 32.

The logic design of the circuit is specified by the designer in the form of interconnections for signal routing. For the simplified circuit of FIG. 3, the connections include the following:

Module 23, pin 33 to Module 24, pin 35;
Module 23, pin 34 to Module 24, pin 36;
Module 24, post 37 to I/O pad 39;
Module 24, post 38 to I/O pad 40.

Again, the program requires the designer to specify only the module placement and the list of interconnecting pin/post pairs. The placement of the actual connecting routes on the routing surface is automatically determined by the program. In the hybrid shown in FIG. 3, the program determines the actual routes 41, 42, 43 and 44 which best satisfy the connections specified.

Figure 4:
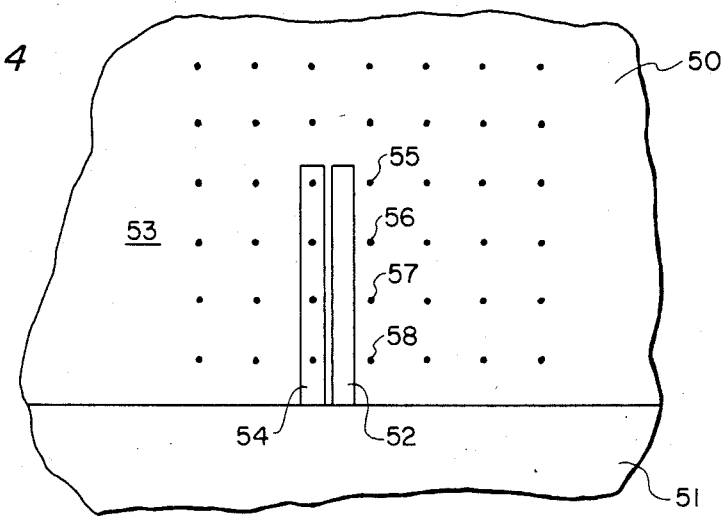
FIG. 4 illustrates an off-grid position for a posted leadless carrier.

A problem arises in the placement of posted leadless carriers as illustrated in greater detail in FIG. 4. In particular, the geometry of a given module may result in at least some of the posts lying at an off-grid position. FIG. 4 shows a section of a hybrid substrate 50 on which is mounted module 51 having post 52 as a connector. The post 52 spans four grid positions 53, indicated by dots, but does not lie directly on any grid point. In order to be able to route these off-grid positions using standard routing procedures, the original post 52 is treated as though it were lying in the on-grid position shown as post 54, and the points 55-58 are designated as pin-guarded positions internal to the program. Once a grid point has been designated as being guarded, routing to that point is not allowed in order to insure that the minimum spacing requirements between conductors is maintained.

INPUT DATA DESCRIPTION

Data is specified in the HYPAR program by one input file made up of several sections, each section specifying a different type of data to the program. These sections are: Mode data, Parameter data, Pin data, Element/Pattern data, Node list, and Route Control data.

Mode Data: This contains the program control and general hybrid layout data. This specifies the x-y size of the hybrid, the grid, and the type of routing to be done, that is, top-down or bottom-up sequential routing.

Parameter Data: These data records allow the user to set program characteristics such as line widths, minimum spacing between non-connected routes, and maximum number of routing levels.

Pin Data: The pin data group contains all of the information describing the geometry of each component. A component can be an IC module, a discrete, an I/O pad or a restricted area. Each component is described using a general information header record followed by a series of pin records equal in number of the number of pins on the module. A restricted area represents an area on the hybrid where routing is not permitted and will have no pin records specified.

The general information record includes the component number and component type, followed by posting data for a module, or restricted area coordinates for a restricted area. The pin cards describe the pin number, pin type, pin coordinates with respect to the component origin and footprint information. The exact location of any element is given by the sum of the coordinates of the element origin and the pin coordinates given in the pin data.

Element/Pattern Data: The element/pattern data relates each element and restricted area on the hybrid to a component which has been described in the pin data file. In addition, all placement data for the element is specified in this section of the data file. The placement data represents the coordinates of the element origin with respect to the hybrid origin.

Node List: The node list specifies the logical interconnectivity of the elements and pins on the hybrid. Weighting factors may be assigned to individual nodes in order to control the order in which pin pairs are routed. Higher node weighted pin pairs are routed before pin pairs of lower node weight. The earlier a pin pair is routed, the more likely it is to obtain a minimum length path, thereby reducing possible time delays and parasitics for the higher weighted nodes.

Route Control Data: Route control data is an option which allows the user to specify routing information to the program. Using the present level option, a particular node may be designated to appear on a particular routing level in order to shield special nodes from undesired parasitics, to minimize a particular route length or to minimize the via count.

PROGRAM OPERATION

The system flowchart of FIG. 1 provides a general description of program operations. For the sake of clarity, the system operation has been divided into four separate phases: input, module placement, network routing and output.

INPUT

Referring to FIG. 1, the design data is specified by the user for input and verification by procedure 10. Using the input parameters provided in the foregoing section, the basic structure of the hybrid module is described in terms of module placement and logic interconnection.

MODULE PLACEMENT

Once the initial placement of the modules has been established in the input phase, their relative positions with respect to each other will remain unchanged. The module placement phase, however, permits limited adjustments to the initial placement in order to improve the potential for future routing. As shown in FIG. 1, this phase can consist of the two separate processes known as "sliding" 11 and "shifting" 12.

Sliding

Figure 5:
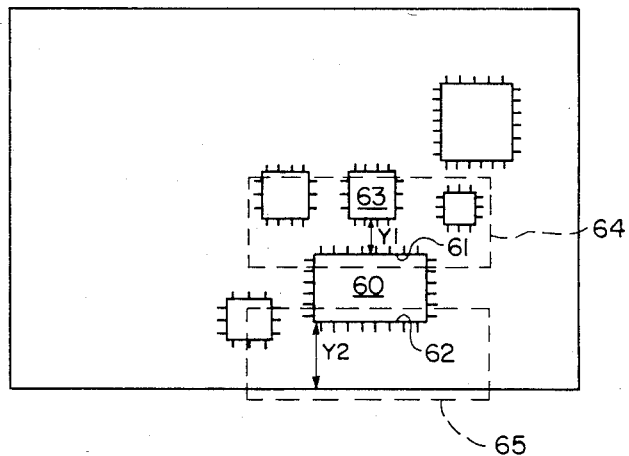
FIG. 5 illustrates grid positioning for module sliding and shifting.

Module sliding refers to the process of moving modules from their designated positions to provide improved spacing for routing between modules. The improvement in spacing is based on the concept that the space available for signal routing between two adjacent modules should be proportionate to the amount of routing expected in that area as determined by connector pin density. Referring to FIG. 5, sliding is based on the total space available between adjacent modules and the pin density calculated for the routing areas along the module sides. This distance is prorated between the sides of the module according to relative pin densities. Also, in many applications it has been found to be advantageous to impose an additional weighting factor on pins used in the power bus and for hybrid I/O pads in order to maintain lower density routing in these areas.

By way of illustration of the sliding procedure, a module 60 is shown in FIG. 5 to be located at a fixed position on the hybrid. The longer edges 61 and 62 of the module 60 are located at a distance Y1 from edge 63 and a distance Y2 from the edge of the hybrid surface. Considering rectangular areas 64 and 65, the pin density within these areas is determined by counting the number of pins within each area. From the example shown in FIG. 5, the pin density of rectangle 64 is given as 42 and the pin density for rectangle 65 is given as 14. Thus, it can be expected that approximately three times as many signal routes will occur near edge 61 as will occur on edge 62. Therefore, the potential routing paths near edge 61 would be improved by increasing distance Y1 while decreasing distance Y2. This process can be repeated for each of the modules using a limit on the amount that a module may move in any one iteration in order to prevent the movement of one module from over-affecting the adjacent modules too rapidly.

Shifting

The shifting procedure involves the movement of each module less than a single grid unit so as to minimize the occurrence of off-grid pin guards, as discussed previously and shown in FIG. 4, and to maximize available routing channels. Each position in the range of one-half grid unit is inspected in each direction for off-grid conditions, the number of pin guards required and the number of routing channels available. The module may then be shifted by less than one grid unit in order to minimize the total number of pins in an off-grid position.

ROUTING PHASE Once the component modules have been established at fixed positions by the module placement phase, the network routing phase is initiated whereby all of the logic routing paths are determined. As shown in FIG. 1, routing consists of "smashing" the node list 13, initializing the routing level 14, and iterating the routing 15 and level compaction 16 processes for each sequential pair of levels.

Smashing

Using a technique commonly known as smashing, each node is broken down into two-pin interconnection pairs for establishing signal routes. Thus, the entire logic network as defined on input is reduced to a list of pin-to-pin connections.

Routing Initialization

The actual routing procedure generates pin-to-pin connections in the following sequence: power bus, power signal, user-specified level and signal routing. This sequence may be varied by using the route control option at the input phase.

Figure 6:
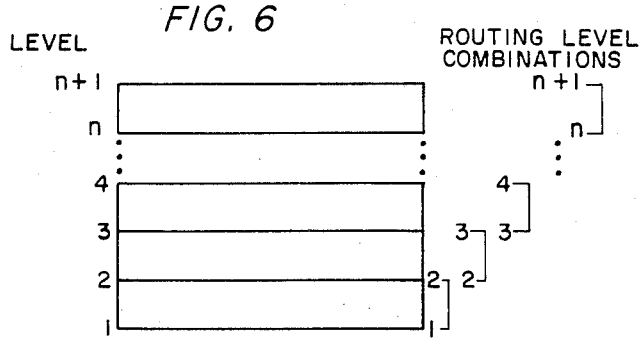
FIG. 6 is a graphic representation of sequential pair routing.

Logic routing is performed on sequential level pairs such that each level is routed in conjunction with each of its adjacent levels. As shown in FIG. 6, levels 1 and 2 are routed first, followed by levels 2 and 3, followed by levels 3 and 4, and so on until routing is completed. As each level is completed for routing purposes, the routing data is output. The routing of levels may be performed either from the bottom level up or from the top level down, as specified by the user. In bottom-up routing, level 1 is on the bottom of the hybrid and is routed first with successive levels being routed and placed on top of this. The method has been found to be advantageous in that the most dense layers of routing are on the bottom, thus minimizing waves in the substrate caused by unequal routing. This method also facilitates the posting of components or leadless packages to the hybrid surface. However, a clear disadvantage arises from the fact that pins or posts must be run from the top level down to the bottom level, using the routing surface on middle levels and blocking many channels above.

In top-down routing, the procedure starts with level 1 on the top of the hybrid and adds successive levels below. Using this method, non-posted pins can be removed from lower levels after the node to which they belong has been completely routed. This method frees more routing space, unblocks channels, and allows greater access to the routing area underneath the devices.

Route Levels N and N1

Each routing level is designated as having a primary direction of travel. The odd-numbered levels primarily have routing in the X-direction and the even-numbered levels have primary routing inthe Y-direction. On any given level, the primary direction is merely the preferred direction and not a fixed requirement. Routing is allowed to travel in the non-primary direction on a level but only if appropriate in view of selection criteria. This process allows travel in the wrong direction for a level thereby providing an escape for positions blocked by adjacent routing. The ability to route in a non-primary direction permits the routing procedure to circumvent certain would-be blockages such as power buses and areas restricted from routing on specific levels.

The routing procedure also uses a technique of creating "valley data" to force routing away from the module pins and into the center areas. In many instances a route can be placed in the center areas instead of near a pin without any adverse effect on route length thereby improving pin accessibility and the routability of subsequent routes. This valley data is generated prior to routing for each pair of levels and is maintained by the program as a separate area surface which is identical to the true routing surface. This separate surface contains the x-y distance of each position from the nearest pin and the data is used by the path finding algorithm to determine the next point to be selected in a given route. The points are chosen based on their distance from the nearest pin so that routing is minimized in this critical area.

Figure 7A:
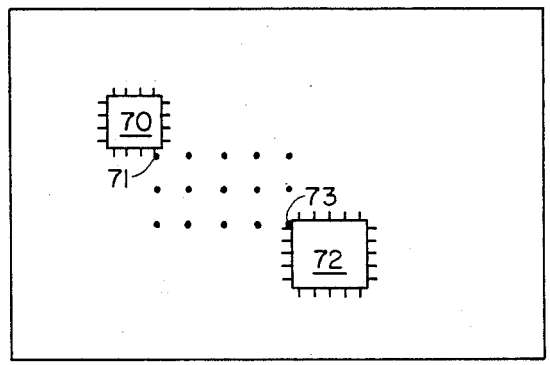
FIGS. 7(a) and 7(b) illustrates the non-energized and energized states, respectively, for signal routing.
Figure 7B:
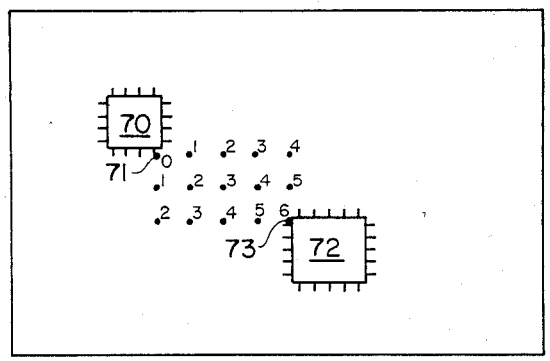

The routing algorithm operates in two phases: energizing and pathfinding. In the energizing phase, the program creates an energy level record of the path from the source pin to the sink pin and verifies that a path does exist. The energizing procedure is shown in FIGS. 7(a) and 7(b) where source pin 71 is contained in module 70, sink pin 73 is contained in module 72 and the dots identify grid points on the routing surface. In FIG. 7(b), the gridpoints are indicated by numbers corresponding to the increasing energy level requirements needed to reach sink pin 73 from source pin 72. For this simple illustration in two dimensions, each single step in the X or Y direction away from the source pin increases the energy level by one unit. Once the sink pin 73 has been reached, shown here as having an energy level of six, the existence of at least one path from pin 71 to pin 73 is assured.

The pathfinding phase begins at sink pin 73 and traces a path back to the source pin 71 using the energy level data and creating a route for this wire. This process is done one step at a time, from one point to the next, until the complete path is established.

As shown in FIG. 7(b), at any given point in the pathfinding phase it is possible for multiple points to satisfy the minimum criteria of decreasing energy level, especially when dealing with a multi-layer surface. The decision as to which of these points is to be chosen as the next point in the path has many ramifications in that the selection affects pin accessibility, future routability, the via count, and crossover count. These factors have an impact on the number of routing levels required to complete the hybrid layout, the manufacturing yield, and the electrical performance of the circuit.

In order to obtain the best result, the program uses multiple criteria to determine the best path selection. After identifying all adjacent points which meet the requriement of decreasing the energy level, these points are evaluated against each other by the multiple criteria of the program. The criteria applied at any specific point may vary according to conditions such as the presence of a new point or a prenode point, a sink point, a point at mid-path, a source point, or user specification for the node.

The multiple criteria used by the program includes the following determinations in selecting the best routing path.

1. Select only points with the lowest energy level of all points with lower energy level. This may result in a group of points all having equal lowest energy levels.

2. Maintain the same routing level as the present point. This avoids the use of a via for electrical or routing considerations.

3. Choose a prenode point over a non-prenode point where such a choice exists.

4. Choose the point with the best valley data in order to keep routing away from other pins.

5. Examine future positions to determine the cumulative result of choosing a particular point.

6. Select a point which maintains the same direction of travel as the present point.

7. Select a point in the primary direction of travel for the level. If a point in the non-primary direction for the level is chosen, examine future paths to determine if the length of this run in the non-preferred direction will be sufficiently short to make allowing travel on the present level in a non-preferred direction appropriate.

8. Choose a point having the shortest X-Y distance from the source pin. This may differ from the energized distance if some of the points have an added weighting factor.

9. Select a point on the lowest possible level number. This packs routing on the level closest to being output and makes more space available on future levels.

Level Compaction and Via Reduction

After each pass of the routing algorithm, this procedure is used to move routed wires from one level to another to improve the routing density and to minimize the via count. The wires are packed onto the lower numbered levels as much as possible, with the constraint that the via count must decrease or stay the same with each move. The moves are made according to the results of a search which is performed at each possible starting point, a via or a pin. The search determines the present route of the wire, the availability of the same route on an adjacent level, the length of the route which is feasible to move, and the reulting change in the via count. The feasibility depends on whether the resulting via count will stay the same or decrease, and the length of the line to be moved is greater than a minimum amount.

The level compaction and via removal routines are intelligent to the fact that a wire can be moved even if the positions are off-grid pin-guarded. Even if the prospective position is off-grid pin-guarded, the present position will also contain an off-grid pin guard, indicating that the off-grid pin causing the guard must be in this node. Thus, the wire can be moved and the old position replaced with off-grid pin guards. This allows level compaction and via removal to be effective even for off-grid conditions.

By moving these routes, more space is freed on higher level numbers for use in creating future routes, thereby lowering the number of routing levels required and increasing routing density. This also lowers the number of vias generated, thus improving the manufacturing capabilities to fabricate the design.

OUTPUT PHASE

As shown in FIG. 1, the output phase makes one final attempt in procedure 17 to eliminate vias in the same manner as the level compaction and via reduction routine of the routing phase.

The final procedure 18 translates the placement and routing data into the Banning Artwork Language for the ultimate fabrication of the hybrid module.

While the invention has been described in connection with specific illustrative embodiments, obvious variations will occur to those skilled in the art. Accordingly, the invention should be limited only by the scope of the appended claims.

What is claimed is:

1. A computer process for automatic layout of hybrid microcircuits comprising the steps of:
   (a) defining the general hybrid layout data, an X-Y orthogonal grid, module geometry and relative placement, and a node list;
   (b) establishing potential routing areas by combining said general hybrid layout data with said module placement data;
   (c) creating a routing subset having all grid point information for the available routing levels;
   (d) smashing the node list into source-pin/sink-pin pairs and sorting the pairs according to a specified routing priority criteria;
   (e) selecting a source-pin/sink-pin pair for routing;
   (f) energizing available paths between said source-pin and said sink-pin;
   (g) creating an energy level record for each of said energized paths;
   (h) establishing said sink-pin as the current point of routing;
   (i) creating a subset of all energized points from said current point of routing which satisfy the minimum criteria of a decreased energy level;
   (j) establishing selection criteria for choosing the next point of routing;
   (k) evaluating all points in the subset created in step (i) by the criteria established in step (j);

(l) routing to the point having the best evaluation data from step (k);

(m) repeating step (i) through step (m) until the source-pin is reached;

(n) repeating step (e) through step (n) for each source-pin/sink-pair determined in step (d) until either:
  (i) no further routing paths exist on the available, routing levels, or
  (ii) no source-pin/sink-pin pairs remain;

(o) translating all connection data in to a language suitable for describing the fabrication layout of the hybrid module.

2. A computer process as set forth in claim 1 wherein routes are established on sequential level pairs such that one level is designated as the primary routing level and the next adjacent level is designated as the alternate routing level.

3. A computer process for automatic layout of hybrid microcircuits as set forth in claim 2 further comprising the steps of:
  (a) packing the established routes onto the lowest possible level when no further routing paths exist on the available routing levels;
  (b) designating the current alternate routing level as the primary routing level; and
  (c) creating a next available routing level as the alternate routing level.

4. A computer process for automatic layout of hybrid microcircuits as set forth in claim 1 wherein said selection criteria for choosing the next point of routing is characterized by the following priority:
  (a) if the subset of all energized points have various energy levels, select only from points with the lowest energy level;
  (b) select only from points on the current routing level if such points exist;
  (c) select a prenode point over a non-prenode point;
  (d) select a point with the best valley data;
  (e) evaluate future positions to determine the cumulative result of selecting a particular point;
  (f) select a point in the same direction of travel as the present point,
  (g) select a point in the preferred direction of travel for the level;
  (h) select a point on the lowest level possible.

5. A computer process as set forth in claim 1 further comprising the steps of:
  (a) sliding the modules in the x and y directions on the grid in order to improve spacing between modules by allowing larger amounts of potential routing area where the node density is the highest; and
  (b) shifting modules by less than one grid unit to minimize off-grid pin conditions.

6. A computer process as set forth in claim 1 wherein said routing priority criteria is characterized by the following order:
  (a) power bus routing;
  (b) power signal routing;
  (c) user specified priority routes;
  (d) all other signal routes.

* * * * *